United States Patent [19]
Puntambekar et al.

[11] Patent Number: 5,714,037
[45] Date of Patent: Feb. 3, 1998

[54] METHOD OF IMPROVING ADHESION BETWEEN THIN FILMS

[75] Inventors: Kumar D. Puntambekar, Santa Clara; K. Y. Ramanujam, Newark; Tom Blount, Mountain View; Ray Liang, San Jose, all of Calif.

[73] Assignee: Microunity Systems Engineering, Inc., Sunnyvale, Calif.

[21] Appl. No.: 649,347

[22] Filed: May 17, 1996

[51] Int. Cl.$^6$ .................................................. C23F 1/00
[52] U.S. Cl. ..................... 156/643.1; 216/67; 216/79; 216/64; 156/646.1; 437/228
[58] Field of Search ..................... 156/625.1, 643.1, 156/646.1, 653.1; 216/64, 67, 72, 79; 437/228

[56] References Cited

U.S. PATENT DOCUMENTS 4,987,102  1/1991  Nguyen et al. ............................ 437/238

*Primary Examiner*—Nam Nguyen
*Assistant Examiner*—Luz Alejandro
*Attorney, Agent, or Firm*—McDermott, Will & Emery

[57] ABSTRACT

Methods for improving adhesion between various materials utilized in the fabrication of integrated circuits. A first method relates to improving adhesion between a silicon nitride layer and a silicon dioxide layer. The method includes treating a surface of the silicon dioxide layer with a nitrogen plasma in a reactive ion etching process prior to depositing the silicon nitride film on the surface of the silicon dioxide layer. A second method relates to improving adhesion between a silicon nitride layer and a polyimide layer. The method includes the step of treating a surface of the silicon nitride layer with a oxygen/argon plasma in a reactive ion etching process prior to depositing the polyimide layer film on the surface of the silicon nitride layer. A third method relates to improving adhesion between a photoresist layer and a metal. The method includes the step of treating a surface of the photoresist layer with a oxygen/argon plasma in a reactive ion etching process prior to depositing the metal on the surface of the photoresist layer.

6 Claims, 2 Drawing Sheets

METHOD OF IMPROVING ADHESION BETWEEN THIN FILMS

The present invention relates generally to a method of improving the adhesion between thin films utilized during the fabrication process of integrated circuit chips.

BACKGROUND OF THE INVENTION

During the fabrication of integrated circuit chips "IC's" various films are deposited over a substrate and utilized in the fabrication process. Often times, some of the films are subsequently removed and are not present in the final IC. It is important, however, that when the thin films are present, that the bond between the thin film and the underlying layer be sufficiently strong such that the thin layer does not separate from or flake off the underlying layer. Any such separation or flaking more often than not results in a defective IC.

For example, during the "metallization" process (i.e., formation of the metal wires of the IC), various thin films, such as polyimide and photoresist, are utilized to pattern the substrate prior to performing a metal deposition, which forms the wires. Poor adhesion between these films and the underlying layers can result in, for example, defective patterning, metal shorts between wires and contacts and/or flaking of the metal forming the wires. Any of the foregoing typically results in a defective chip. This is especially true in IC's having an exceedingly small pitch, for example, less than or equal to one micron.

Accordingly, there exists a need to improve the adhesion between thins films utilized during the metallization process in the fabrication of integrated circuits.

SUMMARY OF THE INVENTION

The present invention relates to methods of improving the adhesion between various films (also referred to as layers) utilized during the fabrication of integrated circuits.

More specifically, a first aspect of the present invention relates to a method for improving adhesion between a silicon nitride layer and a silicon dioxide layer. The method comprises treating a surface of the silicon dioxide layer with a nitrogen plasma in a reactive ion etching process prior to depositing the silicon nitride layer on the surface of the silicon dioxide layer. A second aspect of the present invention relates to a method for improving adhesion between a silicon nitride layer and a polyimide layer. The method comprises treating a surface of the silicon nitride layer with an oxygen/argon plasma in a reactive ion etching process prior to depositing the polyimide layer on the surface of the silicon nitride layer.

A third aspect of the present invention comprises a method for improving adhesion between a photoresist layer and a metal. The method comprises treating a surface of the photoresist layer with an oxygen/argon plasma in a reactive ion etching process prior to depositing the metal on the surface of the photoresist layer.

As described in detail below, the foregoing novel methods of fabricating various portions of an integrated circuit result in improved adhesion between the semiconductor layers/materials noted above. Accordingly, as detailed below, the present invention eliminates numerous problems that result from weak bonds between the various materials utilized during the fabrication of integrated circuits.

The invention itself, together with further objects and advantages, can be better understood by reference to the following detailed description and the accompanying drawings.

DETAILED DESCRIPTION OF THE DRAWINGS

The present invention is described below in conjunction with its use in a metallization process, which will be the subject matter of related U.S. patent applications.

Figure 1A:
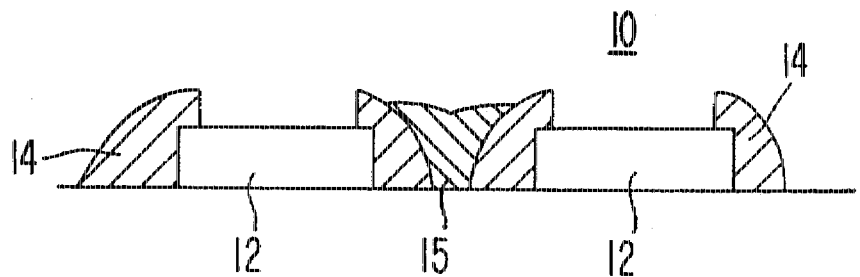
FIGS. 1a–1c illustrate the condition of an integrated circuit die at various stages of the fabrication process.
Figure 1B:
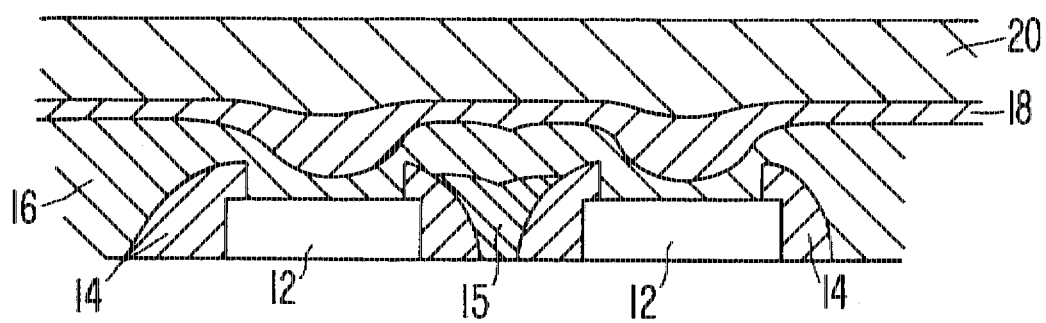
Figure 1C:
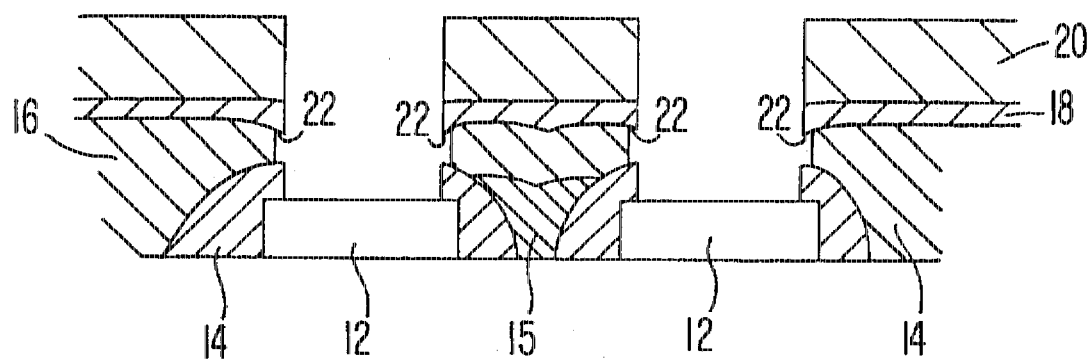

FIGS. 1a–1c illustrate the condition of an integrated circuit die 10 at various stages of the foregoing metallization process. As shown in FIG. 1a, the die 10 comprises base and gate contacts 12, which are partially covered by a layer of densified TEOS 14 (i.e., silicon dioxide). The die 10 further comprises a SDEC (source-drain-emitter-collector) contact 15 disposed between contacts 12.

A silicon nitride film 16 having a thickness of preferably 1000–10,000 Å, more preferably 4000–6000 Å, and most preferably 4500–5500 Å, is then deposited over the die 10 contact by, for example, a chemical-vapor deposition "CVD" process. Next, a polyimide film 18 having a thickness of preferably 200–2500 Å, more preferably 500–1500 Å, and most preferably 650–850 Å, is spun-coated on the silicon nitride film 16. Finally, a photoresist layer 20 having a thickness of preferably 0.6–2.0 microns, more preferably 0.75–1.5 microns, and most preferably 0.9–1.1 microns is spun-coated on the polyimide film 18. The state of the die 10 after deposition of the photoresist layer 20 is illustrated in FIG. 1b.

The die 10 is then etched (i.e., patterned) for metal deposition. First, the photoresist layer 20 is removed via standard photolithograpy techniques. Next, the polyimide film 18 and the silicon nitride film 16 are removed over the base and gate contacts 12 by a standard anisotropic etching process. The anisotropic etch is preferably performed until approximately 1000 Å of the silicon nitride film 16 remains above the gate contact 12. The silicon nitride film 16 is then etched using a standard isotropic etching process so as to create overhangs 22, which are utilized in the metallization process described herein to illustrate the present invention. The state of the die 10 after the etching process is illustrated in FIG. 1c.

Once the etching has been completed, a suitable metal, such as gold, a niobium-gold stack, or a titanium-platinum-gold stack, is deposited over the entire die 10 via a suitable evaporation process. "Liftoff" techniques, which constitute part of the metallization process, are then utilized to remove both the photoresist layer 20 and the polyimide film 18, such that only the silicon nitride film 16 and the metal lines remain on the die 10.

Figure 2A:
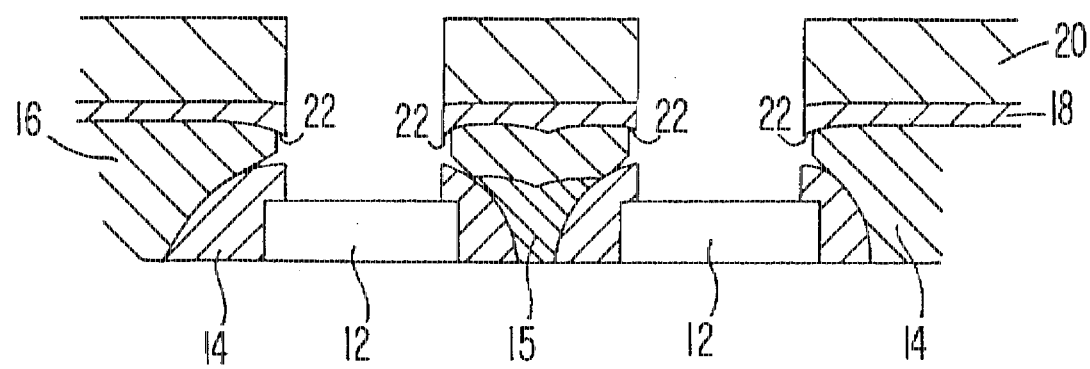
FIGS. 2a–2b illustrate interface attacks resulting from the fabrication process.

Prior to the present invention, the foregoing metallization process often resulted in non-functional circuits due to poor adhesion between the various films. First, as a result of a poor bond between the silicon dioxide film 14 and the silicon nitride film 16, during the isotropic etch of the silicon nitride film 16, the interface between the silicon dioxide film 14 and the silicon nitride film 16 is attacked. Specifically, there is a significant undercut at the interface of the silicon dioxide film 14 and silicon nitride film 16, as shown in FIG. 2a. This undercut/attack results in the removal of the silicon nitride film 16 between the metal lines, which can cause shorts between the metal lines, thereby rendering the device non-functional.

The next problem results from a poor bond between the silicon nitride film 16 and the polyimide film 18.

Figure 2B:
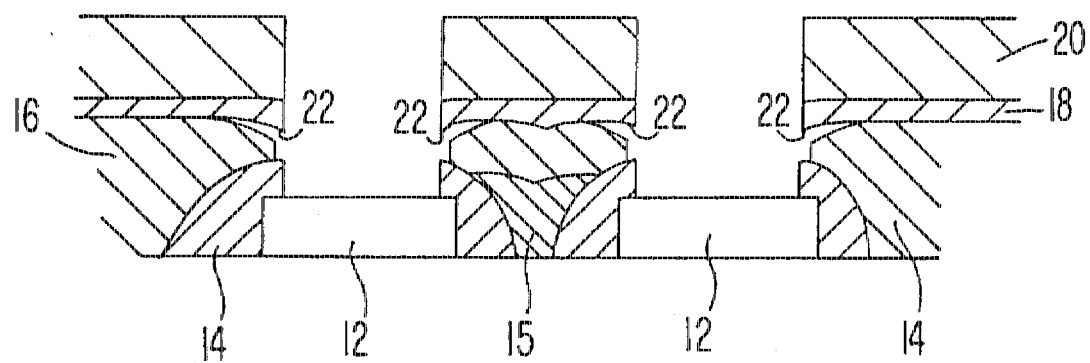

Specifically, as a result of the poor bond, when the silicon nitride film 16 is etched isotropically, there is a substantial undercut/attack of the interface between the silicon nitride film 16 and the polyimide film 18, as shown in FIG. 2b. The undercut causes the polyimide film 18 to be lifted (i.e., fall off) from the silicon nitride film 16, and as a result, causes the photoresist layer 20 to be lifted. Thus, the desired metal pattern is destroyed, which results in a non-functional device.

The third problem results from a poor bond between the photoresist layer 20 and the metal. Specifically, when the metal is deposited, if there is a poor bond between the metal and photoresist layer 20, the stress of the metal causes it to peel away from the photoresist layer 20. Any metal flaking off the photoresist layer 20 typically fouls the process and prevents the proper formation of metal lines. Furthermore, even if particles of metal simply lift-up from the photoresist layer 20, such lift-up causes "shadowing" problems, which also can prevent the proper formation of metal lines.

The present invention addresses each of the three foregoing problems. More specifically, the present invention provides novel methods for adhering nitride films to silicon dioxide films, polyimide films to silicon nitride films and metal to photoresist.

With regard to the first problem, in accordance with the present invention, prior to depositing the silicon nitride film 16, the surface of the silicon dioxide film 14 is treated with a nitrogen plasma in a reactive ion etching "RIE" mode in a plasma etcher. As presently understood, the bombardment of nitrogen on the silicon dioxide film 14 improves adhesion of the subsequently deposited silicon nitride film 16 for at least the following reasons.

First, the bombardment of the silicon dioxide film 14 roughens the upper surface of the silicon dioxide film 14 rendering it more susceptible for accepting the subsequent silicon nitride film 16. Second, the bombardment also results in nitrogen ions being embedded in the surface of the silicon dioxide film 14. These nitrogen ions operate to render the oxide surface compatible to the subsequent silicon nitride film 16, thereby improving adhesion between the silicon dioxide film 14 and the silicon nitride film 16.

Exemplary parameters for operation of the etcher are set forth in Table I below. As shown, in the embodiment illustrated in Table I, the nitrogen treatment is a two-step process. Step 1 is an initialization step necessary to pre-strike the plasma. In Step 2, the silicon dioxide film 14 is treated with 100% nitrogen plasma at a flow rate of approximately 200 sccm in a RIE mode in a plasma etcher operating at a high DC bias on the order of approximately 950 volts or greater. This treatment is performed for approximately 60 seconds. During the treatment, the temperature of the lower electrode of the etcher is maintained in the range of 35°–38° C., and the temperature of the upper electrode is maintained around approximately 20° C.

It is noted that while the operational parameters of the etcher can be varied from the values set forth in Table I, the etching process should be sufficient to result in the implantation of nitrogen ions in the surface of the silicon dioxide film 14.

It is believed the following ranges for the foregoing parameters are acceptable: a nitrogen plasma flow rate ranging from 5–500 sccm, a DC bias of 600 volts or greater, a treatment time ranging from 10–120 seconds, and electrode temperatures ranging from 10° C.–100° C. for the lower electrode, and ranging from 10° C.–100° C. for the upper electrode.

TABLE I

| STEP: 1 | | | PROCESS: N2TEEAT | STEP: 2 | | | PROCESS: O2TEEAT |
|---|---|---|---|---|---|---|---|
| GAS STABILIZATION TIME (SECS) | | 10 | | GAS STABILIZATION TIME (SECS) | | 0 | |
| ADTG ZERO DELAY (MM:SS) | | 0:00 | | ADTG ZERO DELAY (MM:SS) | | 0:00 | |
| CHF3 | FLOW (CC) | 0 | ERROR RANGE %0 | CHF3 | FLOW (CC) | 0 | ERROR RANGE %0 |
| NONE | FLOW (CC) | 0 | ERROR RANGE %0 | NONE | FLOW (CC) | 0 | ERROR RANGE %0 |
| CF4 | FLOW (CC) | 0 | ERROR RANGE %0 | CF4 | FLOW (CC) | 0 | ERROR RANGE %0 |
| O2 | FLOW (CC) | 0 | ERROR RANGE %0 | O2 | FLOW (CC) | 0 | ERROR RANGE %0 |
| SF6 | FLOW (CC) | 0 | ERROR RANGE %0 | SF6 | FLOW (CC) | 0 | ERROR RANGE %0 |
| AR | FLOW (CC) | 200 | ERROR RANGE %0 | AR | FLOW (CC) | 200 | ERROR RANGE %0 |
| HE PRES. (T) | | 12.000 | MAX HE. FLOW 25 | HE PRES. (T) | | 12.000 | MAX HE. FLOW 50 |
| PRESSURE (mT) | | 200 | ERROR RANGE %10 | PRESSURE (mT) | | 150 | ERROR RANGE %10 |
| RF POWER (WT) | | 400 | ERROR RANGE %10 | RF POWER (WT) | | 400 | ERROR RANGE 10 |
| RF REFL. ERROR | | 0 | BIAS UPPER ERROR 0 | RF REFL. ERROR | | 0 | BIAS UPPER ERROR 0 |
| BIAS LOWER | | 0 | ERROR RANGE %0 | BIAS LOWER | | 0 | ERROR RANGE %0 |
| AMN MODE 3 | | | | AMN MODE 3 | | | |
| CHAM 1 - CAPS 1:2:3 | | 3193 | :2826 :0 | CHAM 1 - CAPS 1:2:3 | | 3193 | :2866 :0 |
| CHAM 2 - CAPS 1:2:3 | | 3200 | :2850 :0 | CHAM 2 - CAPS 1:2:3 | | 3200 | :2850 :0 |
| CHAM 3 - CAPS 1:2:3 | | 0 | :0 :0 | CHAM 3 - CAPS 1:2:3 | | 0 | :0 :0 |
| CHAM 4 - CAPS 1:2:3 | | 0 | :- :0 | CHAM 4 - CAPS 1:2:3 | | 0 | :0 :0 |
| ENDPOINT MODE TIME | | MAX. TIME (MM:SS) | 0:05 | ENDPOINT MODE TIME | | MAX. TIME (MM:SS) | 1:00 |
| USING CHANNEL 02020 | | START DELAY (MM:SS) | 0:00 | USING CHANNEL 02020 | | START DELAY (MM:SS) | 0:00 |
| CHANNEL #1234567 | | ABORT TIME (MM:SS) | 0:00 | CHANNEL #1234567 | | ABORT TIME (MM:SS) | 0:00 |
| CHANNEL GAIN LHLLLLL | | FILTER CONSTANT | 0.000 | CHANNEL GAIN LHLLLLL | | FILTER CONSTANT | 0.000 |
| CHAM 1 - THRESHOLD | | 0.000 | DELTA 0.000 | CHAM 1 - THRESHOLD | | 0.800 | DELTA 0.000 |
| CHAM 2 - THRESHOLD | | 0.000 | DELTA 0.000 | CHAM 2 - THRESHOLD | | 0.000 | DELTA 0.000 |
| CHAM 3 - THRESHOLD | | 0.000 | DELTA 0.000 | CHAM 3 - THRESHOLD | | 0.000 | DELTA 0.000 |
| CHAM 4 - THRESHOLD | | 0.000 | DELTA 0.000 | CHAM 4 - THRESHOLD | | 0.000 | DELTA 0.000 |
| % OVERETCH | | 0 | | % OVERETCH | | 0 | |
| TIMED OVERETCH (MM:SS) | | 0:00 | | TIMED OVERETCH (MM:SS) | | 0:00 | |
| GAS EVAC. TIME (SECS) | | 0 | | GAS EVAC. TIME (SECS) | | 0 | |
| THIS STEP IS ALLOWED IN CHAMBER 2 | | | | THIS STEP IS ALLOWED IN CHAMBER 2 | | | |

As a result of the foregoing nitrogen treatment, there is a substantial improvement in adhesion between the silicon dioxide film 14 and the silicon nitride film 16. The improved adhesion between the layers functions to eliminate the interface attack between the layers, which was exhibited without such treatment.

Turning to the second problem, the present invention also provides a treatment for improving the adhesion between the silicon nitride film 16 and the polyimide film 18. More specifically, prior to depositing the polyimide film 18, the silicon nitride film 16 is treated with an oxygen/argon plasma in an RIE mode in a plasma etcher. As presently understood, the adhesion between the silicon nitride film 16 and the polyimide film 18 is improved for at least the following reasons.

Similar to above, the argon ions operate to roughen the upper surface of the silicon nitride film 16, thereby making the surface more susceptible to accepting the oxygen ions also contained in the plasma. Accordingly, at the conclusion of the oxygen/argon treatment, oxygen ions are embedded in the upper surface of the silicon nitride film 16. The oxygen ions embedded in the surface of the silicon nitride film 16 operate to render the surface of the nitride compatible to the subsequent deposition of the polyimide film 18.

More specifically, by embedding oxygen ions in the nitride surface, the nitride surface is converted to an oxide or oxynitride film. The newly formed oxide or oxynitride film exhibits increased adhesion with the polyimide layer, because polyimide contains adhesion promoters designed to work on silicon dioxide (i.e., an oxide surface). Thus, the result of the treatment is improved adhesion between the silicon nitride film 16 and the polyimide film 18. It is noted that the argon also functions to excite the plasma.

As shown in detail in Table II, in one exemplary embodiment, the silicon nitride film 16 is treated with an oxygen/argon plasma, having a oxygen-to-argon ratio of approximately 3.33 to 1, in a RIE mode in a plasma etcher operating at a high DC bias on the order of approximately 500 volts or greater. This treatment is performed for approximately one minute.

It is noted that while the operational parameters of the etcher can be varied from the values set forth in Table II, the etching process should be sufficient to result in the implantation of oxygen ions in the surface of the silicon nitride film 16.

It is believed the following ranges for the foregoing parameters are acceptable: an oxygen flow rate ranging from 0.5-15 sccm, an argon flow rate ranging from 5-500 sccm, a DC bias of 500 volts or greater, a treatment time ranging from 10-120 seconds, and electrode temperatures ranging from 10° C.-100° C. for the lower electrode, and ranging from 10° C.-100° C. for the upper electrode.

TABLE II

| STEP: 1 | | PROCESS: O2TEEAT | |
|---|---|---|---|
| GAS STABILIZATION TIME (SECS) | | 15 | |
| ADTG ZERO DELAY (MM:SS) | | 0:00 | |
| CHF3 | FLOW (CC) | 0 | ERROR RANGE %0 |
| NONE | FLOW (CC) | 0 | ERROR RANGE %0 |
| CF4 | FLOW (CC) | 0 | ERROR RANGE %0 |
| O2 | FLOW (CC) | 100 | ERROR RANGE %20 |
| SF6 | FLOW (CC) | 0 | ERROR RANGE %0 |
| AR | FLOW (CC) | 30 | ERROR RANGE %10 |
| HE PRES. (T) | | 12.000 | MAX HE. FLOW 50 |
| PRESSURE (mT) | | 150 | ERROR RANGE %15 |

TABLE II-continued

| STEP: 1 | PROCESS: O2TEEAT | | |
|---|---|---|---|
| RF POWER (WT) | 400 | ERROR RANGE %0 | |
| RF REFL. ERROR | 0 | BIAS UPPER ERROR 0 | |
| BIAS LOWER | 0 | ERROR RANGE %0 | |
| AMN MODE 3 | | | |
| CHAM 1 - CAPS 1:2:3 | 0 | :0 | :0 |
| CHAM 2 - CAPS 1:2:3 | 2711 | :2989 | :0 |
| CHAM 3 - CAPS 1:2:3 | 2638 | :2765 | :0 |
| CHAM 4 - CAPS 1:2:3 | 3047 | :2547 | :0 |
| ENDPOINT MODE TIME | MAX. TIME (MM:SS) | | 1:00 |
| USING CHANNEL 02020 | START DELAY (MM:SS) | | 0:00 |
| CHANNEL #1234567 | ABORT TIME (MM:SS) | | 0:00 |
| CHANNEL GAIN LHLLLLL | FILTER CONSTANT | | 0.300 |
| CHAM 1 - THRESHOLD | 0.800 | DELTA | 50.000 |
| CHAM 2 - THRESHOLD | 0.800 | DELTA | 50.000 |
| CHAM 3 - THRESHOLD | 0.800 | DELTA | 50.000 |
| CHAM 4 - THRESHOLD | 0.300 | DELTA | 50.000 |
| % OVERETCH | 0 | | |
| TIMED OVERETCH (MM:SS) | 0:00 | | |
| GAS EVAC. TIME (SECS) | 5 | | |
| THIS STEP IS ALLOWED IN CHAMBER 3 | | | |

As a result of the foregoing oxygen/argon treatment, there is a substantial improvement in adhesion between the silicon nitride film 16 and the polyimide film 18. The improved adhesion between the silicon nitride film 16 and the polyimide film 18 functions to eliminate the interface attack between these layers, which was exhibited without such treatment. Accordingly, the problem described above, in which the photoresist layer 20 was lifting-off due to the interface attack between the silicon nitride film 16 and the polyimide film 18 is eliminated by the present invention.

Turning to the final problem, the present invention also provides a treatment for improving the adhesion between the metal and the photoresist layer 20. Specifically, after the etching process is complete (see, FIG. 1c) and prior to depositing the metal, the photoresist layer 20 is first treated with an oxygen/argon plasma in RIE mode in a plasma etcher, and then the photoresist layer 20 is subjected to an ultra-violet "UV" light/cure process. As presently understood, the adhesion between the metal and the photoresist layer 20 is improved for at least the following reasons.

The oxygen ions in the oxygen/argon plasma, which preferable has a high ratio of argon to oxygen, operate to remove a slight portion of the top surface of the photoresist layer 20, while simultaneously the argon ions roughen the upper surface of the photoresist layer 20. The removal of the upper surface of the photoresist operates to remove fluorinated resist caused by the etching process, which hampers the formation of a strong bond between the photoresist layer 20 and the metal. The UV light treatment operates to cure the upper surface of the photoresist layer 20, thereby forming a crust on the top surface. Thus, as a result of the foregoing process, the upper surface of the photoresist layer 20 is both roughened and hardened, thereby improving adhesion between the metal and the photoresist layer 20. It is noted that the UV light treatment of the photoresist layer 20 is performed after the etching process.

As shown in detail in Table III, in one exemplary embodiment, the photoresist layer 20 is treated with an oxygen/argon plasma, having an argon-to-oxygen ratio of approximately 60 to 1, in a RIE mode in a plasma etcher operating at a DC bias on the order of approximately 400 volts or greater. This treatment is performed for approximately ten seconds.

TABLE III

| STEP: 1 | | PROCESS: PETEEAT | |
|---|---|---|---|
| GAS STABILIZATION TIME (SECS) | 30 | | |
| ADTG ZERO DELAY (MM:SS) | 0:00 | | |
| CHF3 FLOW (CC) | 0 | ERROR RANGE %0 | |
| NONE FLOW (CC) | 0 | ERROR RANGE %0 | |
| CF4 FLOW (CC) | 0 | ERROR RANGE %0 | |
| O2 FLOW (CC) | 3 | ERROR RANGE %0 | |
| SF6 FLOW (CC) | 0 | ERROR RANGE %0 | |
| AR FLOW (CC) | 180 | ERROR RANGE %10 | |
| HE PRES. (T) | 6.000 | MAX HE. FLOW 50 | |
| PRESSURE (mT) | 100 | ERROR RANGE %10 | |
| RF POWER (WT) | 150 | ERROR RANGE %10 | |
| RF REFL. ERROR | 0 | BIAS UPPER ERROR 0 | |
| BIAS LOWER | 0 | ERROR RANGE %0 | |
| AMN MODE 3 | | | |
| CHAM 1 - CAPS 1:2:3 | 0 | :0 | :0 |
| CHAM 2 - CAPS 1:2:3 | 0 | :0 | :0 |
| CHAM 3 - CAPS 1:2:3 | 0 | :0 | :0 |
| CHAM 4 - CAPS 1:2:3 | 3571 | :2370 | :0 |
| ENDPOINT MODE TIME | MAX. TIME (MM:SS) | 0:10 | |
| USING CHANNEL 50500 | START DELAY (MM:SS) | 0:00 | |
| CHANNEL #1234567 | ABORT TIME (MM:SS) | 0:00 | |
| CHANNEL GAIN LHLLLLL | FILTER CONSTANT | 0.300 | |
| CHAM 1 - THRESHOLD | 0.000 | DELTA | 0.000 |
| CHAM 2 - THRESHOLD | 0.000 | DELTA | 0.000 |
| CHAM 3 - THRESHOLD | 0.000 | DELTA | 0.000 |
| CHAM 4 - THRESHOLD | 0.000 | DELTA | 0.000 |
| % OVERETCH | 0 | | |
| TIMED OVERETCH (MM:SS) | 0:00 | | |
| GAS EVAC. TIME (SECS) | 5 | | |
| THIS STEP IS ALLOWED IN CHAMBER 4 | | | |

It is noted that while the operational parameters of the etcher can be varied from the values set forth in Table III, the etching process should be sufficient to remove any fluorinated resist formed on the upper surface of the photoresist layer 20. It is believed the following ranges for the foregoing parameters are acceptable: an oxygen flow rate ranging from 0.5–15 sccm, an argon flow rate ranging from 5–500 sccm, a DC bias of 400 volts or greater, a treatment time ranging from 10–120 seconds, and electrode temperatures ranging from 10° C.–100° C. for the lower electrode, and ranging from 10° C.–100° C. for the upper electrode.

As a result of the foregoing oxygen/argon treatment, there is a substantial improvement in adhesion between the metal and the photoresist layer 20. The improved adhesion between these layers functions to prevent the metal from peeling off the photoresist during the metal evaporation process. Accordingly, the problem described above is eliminated by the present invention.

As described above, the foregoing novel methods of fabricating an integrated circuit result in improved adhesion between the various semiconductor materials noted above. The present invention eliminates numerous problems that result from weak bonds between the various materials utilized during the fabrication process. The elimination of these problems enhances the overall yield of the manufacturing process. It is also noted that the present invention is not intended to be limited to use with the foregoing metallization process.

Of course, it should be understood that a wide range of changes and modifications can be made to the exemplary embodiments described above. It is therefore intended that the foregoing detailed description be regarded as illustrative rather than limiting and that it be understood that it is the following claims, including all equivalents, which are intended to define the scope of this invention.

What is claimed is:

1. A method for improving adhesion between a silicon nitride layer and a silicon dioxide layer comprising a step of treating a surface of the silicon dioxide layer with a nitrogen plasma in an etching process prior to depositing the silicon nitride layer on said surface of the silicon dioxide layer.

2. The method of claim 1, wherein said etching process is a reactive ion etching process.

3. The method of claim 2, wherein a plurality of nitrogen ions are embedded in said silicon dioxide layer by said etching process.

4. The method of claim 2, wherein said reactive ion process utilizes a plasma etcher operating at a DC bias of at least 800 volts.

5. The method of claim 1, wherein said nitrogen plasma comprises 100% nitrogen.

6. The method of claim 1, wherein said nitrogen plasma has a flow rate ranging from 5–500 sccm.

* * * * *